US010544507B2

(12) United States Patent
Funatsu et al.

(10) Patent No.: US 10,544,507 B2
(45) Date of Patent: Jan. 28, 2020

(54) FILM FORMING APPARATUS

(71) Applicant: HONDA MOTOR CO., LTD, Minato-ku, Tokyo (JP)

(72) Inventors: Junya Funatsu, Tochigi-ken (JP); Koji Kobayashi, Tochigi-ken (JP); Nobuhiko Yoshimoto, Tochigi-ken (JP)

(73) Assignee: HONDA MOTOR CO., LTD., Tokyo (JP)

( * ) Notice: Subject to any disclaimer, the term of this patent is extended or adjusted under 35 U.S.C. 154(b) by 141 days.

(21) Appl. No.: 15/715,299

(22) Filed: Sep. 26, 2017

(65) Prior Publication Data
US 2018/0094349 A1 Apr. 5, 2018

(30) Foreign Application Priority Data
Sep. 30, 2016 (JP) .................................. 2016-194372

(51) Int. Cl.
C23C 16/04 (2006.01)
C23C 16/44 (2006.01)
C23C 16/50 (2006.01)

(52) U.S. Cl.
CPC ........ *C23C 16/4412* (2013.01); *C23C 16/042* (2013.01); *C23C 16/045* (2013.01); *C23C 16/50* (2013.01)

(58) Field of Classification Search
CPC ..... C23C 16/042; C23C 16/045; C23C 16/50; C23C 16/4412; C23C 16/04
See application file for complete search history.

(56) References Cited

U.S. PATENT DOCUMENTS 4,732,761 A * 3/1988 Machida ............... C23C 14/357
            204/192.23
5,897,713 A * 4/1999 Tomioka ............... C23C 16/401
            118/723 I
(Continued)

FOREIGN PATENT DOCUMENTS

JP    2014-47379    *  3/2014
WO    2015133490       9/2015

OTHER PUBLICATIONS

Automotive Design & Production blog by Gary S. Vasilash, "Cylinder Coating for Improved Performance". Aug. 8, 2017, pp. 1-3.*

(Continued)

*Primary Examiner* — Bret P Chen
(74) *Attorney, Agent, or Firm* — Amin, Turocy & Watson, LLP

(57) ABSTRACT

A film forming apparatus (10) includes a mask body (34) configured to expose inner surfaces (14a) of cylinder bores (14), and mask an inner surface (16a) of a crankcase (16). The mask body (34) includes a main body portion (104), a sealing member (106) and a biasing member (108). The main body portion (104) is configured to stretch and contract, and includes a first tubular member (100) and a second tubular member (102) configured to have an insert structure at least part of which is slidable along an axial direction. The main body portion (104) can stretch and contact in a state where at least one end in the axial direction thereof contacts an inner surface of a cylinder block (12). The sealing member (106) is interposed between sliding surfaces of the first tubular member (100) and the second tubular member (102). The biasing member (108) is configured to resiliently bias the first tubular member (100) and the second tubular member (102) in a stretching direction of the main body portion (104).

3 Claims, 3 Drawing Sheets

(56) References Cited

U.S. PATENT DOCUMENTS

| | | | | |
|---|---|---|---|---|
| 6,676,757 | B2* | 1/2004 | Kitano | G03F 7/162 118/52 |
| 7,666,766 | B2* | 2/2010 | Hiura | C23C 16/24 118/723 E |
| 8,399,362 | B2* | 3/2013 | Yamazaki | C23C 14/12 257/E21.024 |
| 2003/0154919 | A1* | 8/2003 | Rice | B05B 12/20 118/504 |
| 2012/0040132 | A1* | 2/2012 | Eto | B32B 15/016 428/131 |
| 2012/0085654 | A1* | 4/2012 | Bergmann | C25D 5/022 205/122 |
| 2015/0292432 | A1* | 10/2015 | Stephenson | F02F 1/00 123/664 |
| 2015/0311044 | A1* | 10/2015 | Sun | H01J 37/32477 428/139 |
| 2016/0079043 | A1* | 3/2016 | Kobayashi | H01L 21/31138 438/714 |
| 2016/0245224 | A1* | 8/2016 | Ruona | F02F 3/10 |
| 2016/0369737 | A1 | 12/2016 | Kobayashi et al. | |

OTHER PUBLICATIONS

Article in AdvancedManufacturing.org. "Cylinder Bore Coating: Ready for Prime Time". May 29, 2014, pp. 1-2.*

Gangopadhyay, A., et al., "Engine Friction Reduction Through Surface Finish and Coatings". Ford Research and Advanced Engineering, DEER Conference, Oct. 19, 2012, pp. 1-17.*

Gerardo, Carlos D., et al., "Fabrication and testing of polymer-based capacitive micromachined ultrasound transducers for medical imaging". Microsystems & Nanoengineering (2018) 4:19, pp. 1-12.*

Article by Nissan Technological Development Activities. "Mirror Bore Coating", pp. 1-2. No date available.*

Ernst, Peter, et al., "Optimizing the Cylinder Running Surface/Piston System of Internal Combustion Engines Towards Lower Emissions". SAE International, 2012-32/0092, Oct. 23, 2012, pp. 1-12.*

* cited by examiner

FILM FORMING APPARATUS

CROSS-REFERENCE TO RELATED APPLICATION

This application is based upon and claims the benefit of priority from Japanese Patent Application No. 2016-194372 filed on Sep. 30, 2016, the contents of which are incorporated herein by reference.

BACKGROUND OF THE INVENTION

Field of the Invention

The present invention relates to a film forming apparatus that forms a film on an inner surface of a cylindrical work.

Description of the Related Art

International Publication No. WO 2015/133490 discloses, for example, a technique of forming a film on an inner surface of a cylindrical work. More specifically, when a cylinder block is a work, in order to improve lubricity and abrasion resistance of inner surfaces of cylindrical cylinder bores on which pistons slide, a film made of a diamond-like carbon or the like is formed by a plasma chemical vapor deposition method.

By the way, when the cylinder block is the work, the film may be formed on the inner surfaces of the cylinder bores on which the piston slides, and the film does not particularly need to be formed on an inner surface of a crankcase. Consequently, by avoiding formation of the film on the inner surface of the crankcase, it is possible to improve a film material yield. Thus, to partially form a film on the inner surface of the cylindrical work, film formation portions at which the film is formed may be exposed, and a non-formation portion at which the film is not formed may be masked by a mask member.

SUMMARY OF THE INVENTION

A work and a mask member receive an input of heat from plasma during film formation, raise temperatures and therefore readily thermally expand. It is concerned that, when the work or the mask member thermally expands, a vacuum state of a film forming apparatus cannot be maintained, and as a result, film formation precision and film formation quality lower.

A main object of the present invention is to provide a film forming apparatus that can precisely form a high quality film at a film formation portion on an inner surface of a cylindrical work.

One embodiment of the present invention provides a film forming apparatus configured to form a film at a film formation portion on an inner surface of a cylindrical work, the film forming apparatus including a mask body configured to expose the film formation portion, and mask a non-formation portion of the inner surface of the work where the film is not formed, wherein the mask body includes: a main body portion configured to stretch and contract, and including a plurality of tubular members configured to have an insert structure at least part of which is slidable along an axial direction; a sealing member interposed between sliding surfaces of the tubular members; and a biasing member configured to resiliently bias the tubular members in a stretching direction of the main body portion; and the main body portion is capable of stretching and contracting in a state in which at least one end in the axial direction of the main body portion is in contact with the inner surface of the work.

In the film forming apparatus according to the present invention, in a state where at least one end in an axial direction of the main body portion is resiliently biased so as to be in contact with the inner surface of the work, in other words, in a state where the main body portion contracts against a resilient force of a biasing member, the mask body is disposed on the work. Thus, the film formation portion is exposed and the non-formation portion is masked. Consequently, even when the work or the mask body thermally expands during film formation, it is possible to stretch and contract the main body portion following the thermal expansion. That is, it is possible to maintain a state where the main body portion is in contact with the inner surface of the work, and precisely limit a film formation range of the inner surface of the work.

As described above, a sealing member is interposed between sliding surfaces of tubular members that form the main body portion. Consequently, it is possible to maintain a vacuum state of an interior of the main body portion well during film formation, and prevent plasma or a film source gas and the like from leaking from between the tubular members to the outside. Consequently, it is possible to avoid a decrease in film formation quality.

As described above, even when the work or the mask body thermally expands during film formation, this film forming apparatus can precisely form a high quality film at the film formation portion of the inner surface of the work.

Preferably, the film forming apparatus further includes: a housing including a first wall portion in contact with one end side in the axial direction of the work, and a second wall portion in contact with another end side, the housing configured to form an airtight space in which the work is housed; a source gas supply device configured to supply a source gas of the film to an interior of the work via a first opening formed in the first wall portion; an anode case communicating with the interior of the work via a second opening formed in the second wall portion, and electrically insulated from an anode electrode; an insulation member interposed between the anode case and the housing to electrically insulate the anode case and the housing from each other; and an exhaust device configured to exhaust the interior of the work and an interior of the housing via the anode case; and the one end in the axial direction of the main body portion is in contact with the inner surface of the work, and another end is in contact with the insulation member via the second opening.

In this case, the main body portion can stretch and contract between the inner surface of the work and the insulation member. Consequently, even when the mask body or the like thermally expands during film formation, it is possible to maintain a state where the main body portion is in contact with the work and the insulation member, and avoid application of an excessively great force from the main body portion to the work and the insulation member. Consequently, the other end of the work does not become distant from the second wall portion, and it is possible to avoid formation of a gap that is formed between the work and the second wall portion and would otherwise cause leakage of plasma, a source gas, etc. Similarly, the insulation member does not become distant from the housing, and it is possible to keep airtightness between the housing and the anode case well. As a result, it is possible to precisely form a high quality film at the film formation portion of the work.

The mask body resiliently biases the work with respect to the first wall portion, so that it is possible to position and fix the work in the housing. Consequently, the work does not need to be fastened, so that a simple configuration makes it possible to efficiently set the work in the housing, and improve mass production efficiency.

Preferably, in the film forming apparatus, the plurality of tubular members include: a first tubular member including one end side in the axial direction which is in contact with the inner surface of the work; and a second tubular member disposed near the second wall portion compared to the first tubular member; and an outer circumferential surface of the first tubular member and an inner circumferential surface of the second tubular member are in sliding contact with each other. In the axial direction of the main body, one end side is an upstream (first opening) side of the source gas, and the other side is a downstream (second opening) side.

In this case, an inlet of the main body portion that enables an inflow of a gas toward the sealing member between the sliding surfaces of the first tubular member and the second tubular member is between the other end of the first tubular member and an inner circumferential surface of the second tubular member and between one end portion of the second tubular member and an outer circumferential surface of the first tubular member. The one end portion of the second tubular member that is near the first opening compared to the other end portion of the first tubular member is disposed at an outer circumference side of the first tubular member. That is, the one end portion of the second tubular member is disposed outside a plasma generation space. Consequently, an inflow of plasma or the like from between the one end portion of the second tubular member and the outer circumferential surface of the first tubular member toward the sealing member is prevented.

The other end portion of the first tubular member disposed inside the plasma generation space at an inner circumference side of the second tubular member is distant from the first opening, and is thereby disposed at a portion of a low plasma concentration compared to the portion around the first opening. By this means, the inflow of plasma or the like from between the other end portion of the first tubular member and the inner circumferential surface of the second tubular member toward the sealing member is prevented. As a result, it is possible to effectively prevent deterioration of the sealing member due to contact with plasma or the like.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A preferred embodiment of a film forming apparatus according to the present invention will be described in detail with reference to the accompanying drawings.

The film forming apparatus according to the present invention can selectively form a film at a film formation portion of an inner surface of a cylindrical work. The inner surface includes the film formation portion at which the film is formed, and a non-formation portion at which the film is not formed. This film forming apparatus is applicable to various works and is particularly suitably applicable to form a film on inner surfaces of cylindrical cylinder bores of a cylinder block.

Figure 1:
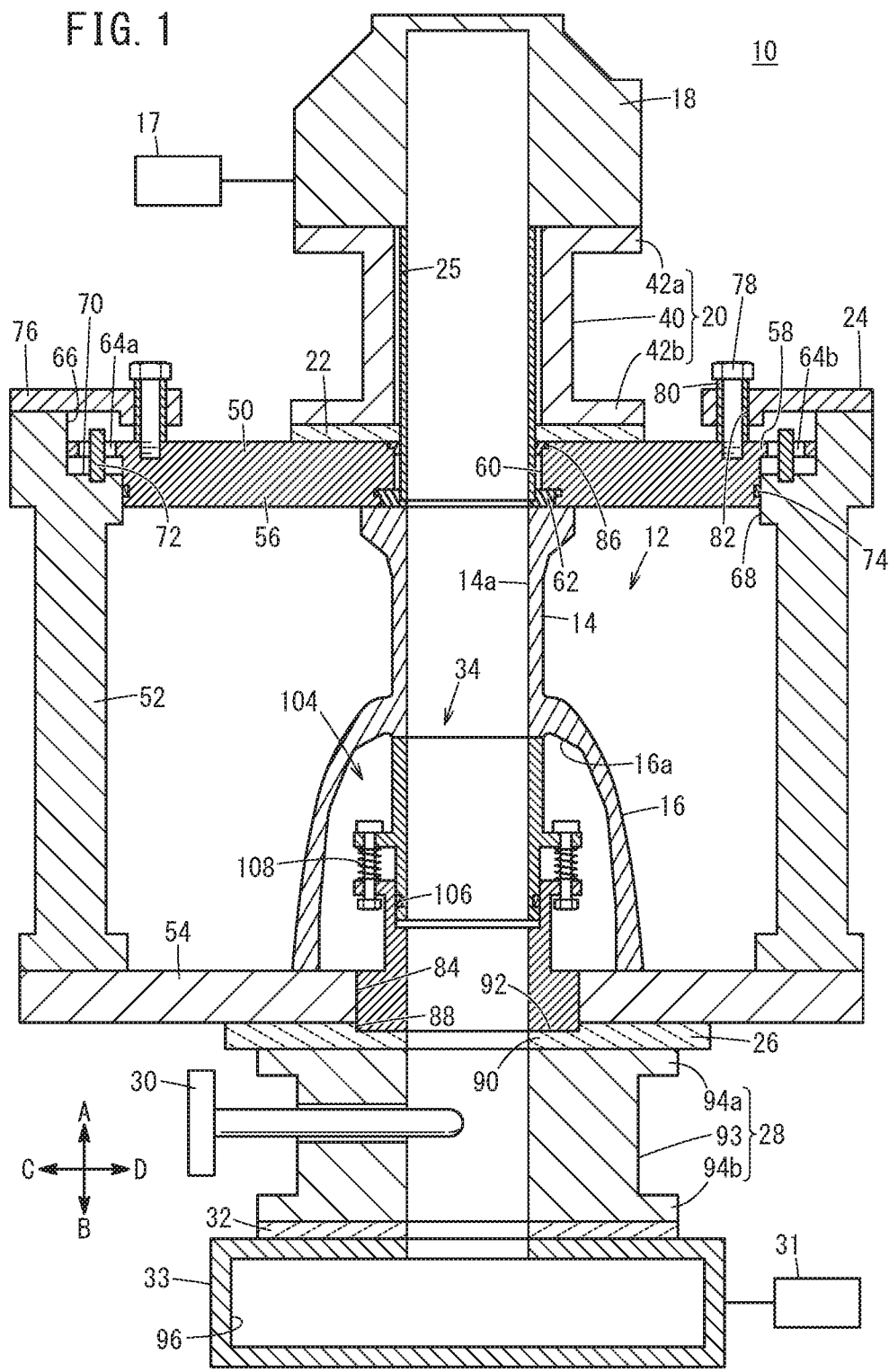
FIG. 1 is a schematic cross-sectional view of the main part of a film forming apparatus according to the present invention.
Figure 2:
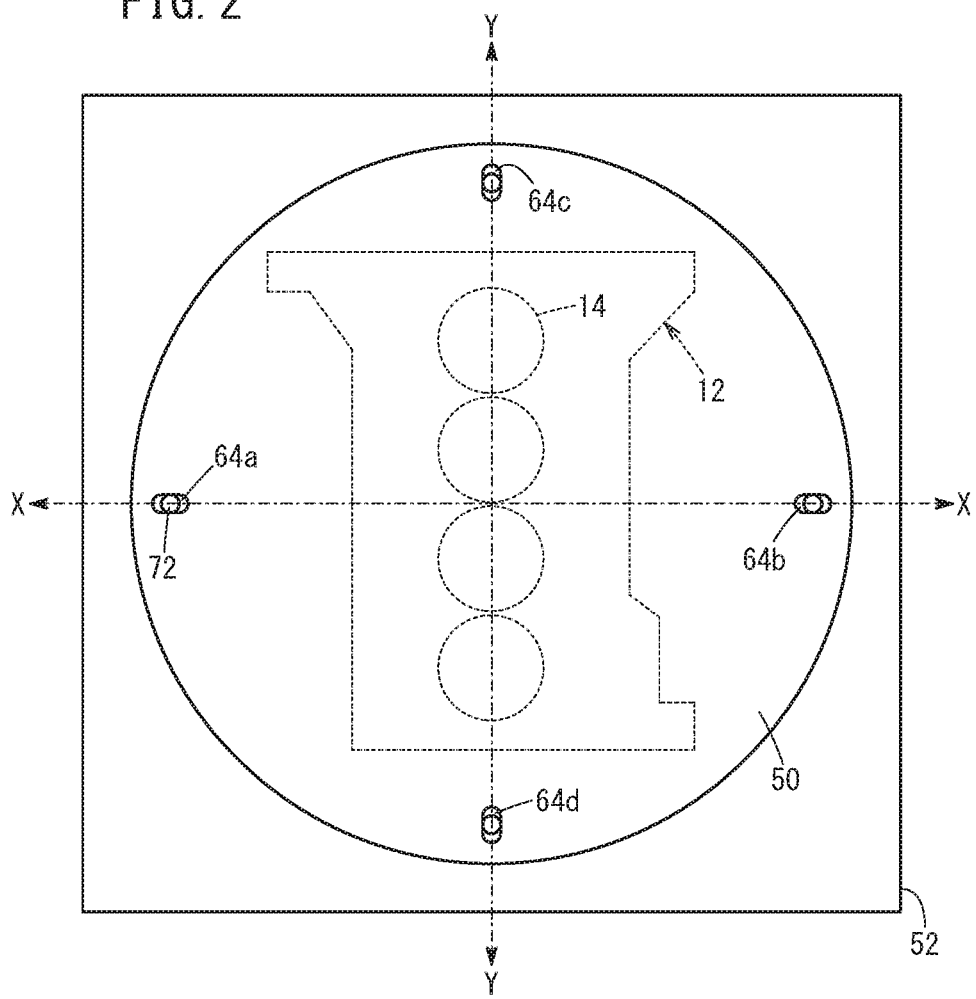
FIG. 2 is a plan view of a housing in FIG. 1.
Figure 3:
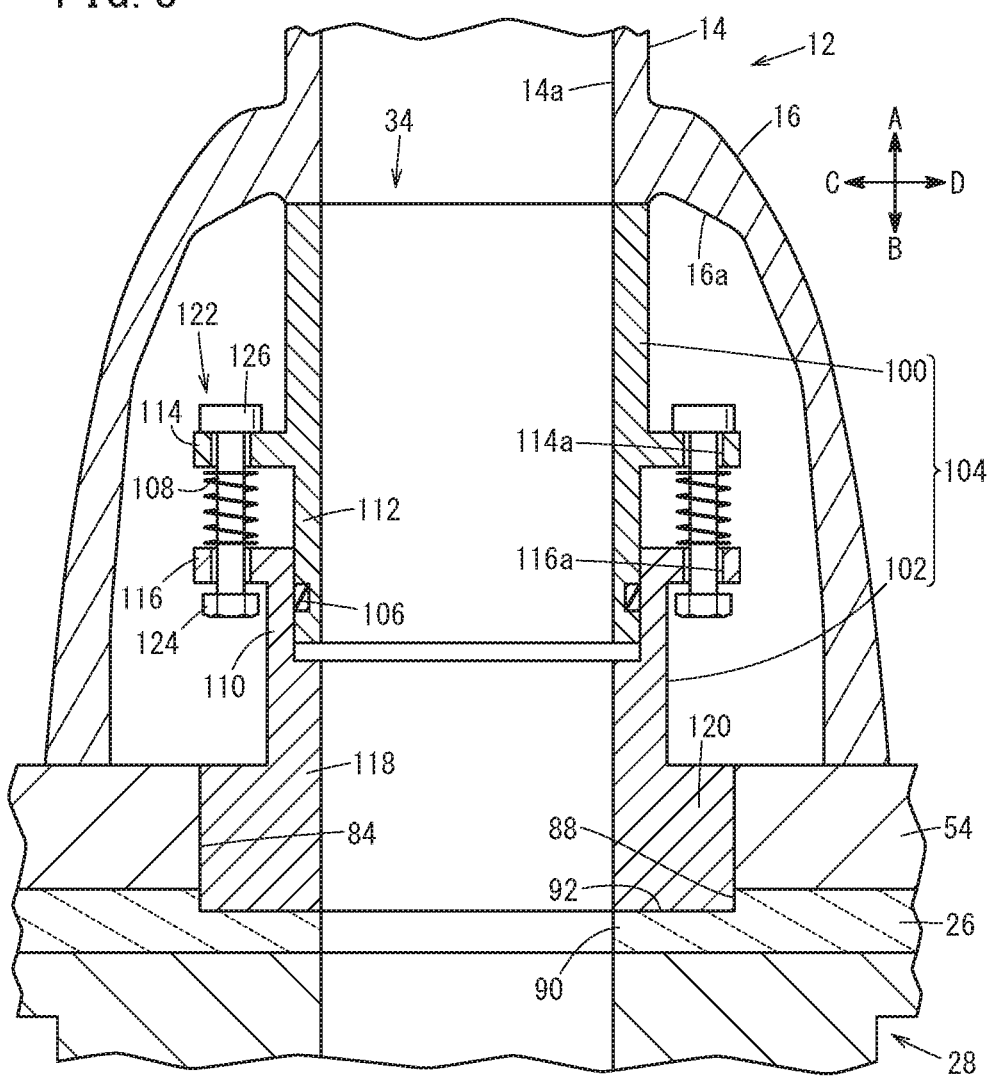
FIG. 3 is a partially enlarged view of a mask body in FIG. 1 and the proximity of the mask body.

The present embodiment describes an example where, as shown in FIGS. 1 to 3, in a film forming apparatus 10, a multi-cylinder type cylinder block 12 is a work, inner surfaces 14*a* of cylinder bores 14 are film formation portions and an inner surface 16*a* of a crankcase 16 is a non-formation portion. However, the present embodiment is not limited to this in particular.

The cylinder block 12 is a multi-cylinder type formed by aligning four cylinders in a direction of arrow Y in FIG. 2 (a direction perpendicular to a sheet surface of FIG. 1). Each cylinder is formed by the cylinder bore 14 and the crankcase 16. The cylinder block 12 is, for example, a casting made of aluminum alloy, and is a so-called linerless type that a piston (not shown) slides inside each cylinder bore 14.

The piston is coupled to a crankshaft housed in the crankcase 16 via a connecting rod (both are not shown). Hence, accompanying rotation of the crankshaft, the piston makes a reciprocating operation in each cylinder bore 14. In order to enhance a lubricating ability and a sliding property of each inner surface 14*a* of each cylinder bore 14, a Plasma Chemical Vapor Deposition (Plasma CVD) method by the film forming apparatus 10 is used as described below to form a film such as a diamond-like carbon (DLC) film.

The film forming apparatus 10 includes a source gas supply device 17, a closing member 18, a coupling case 20, a first insulation member 22, a housing 24, a protection member 25, a second insulation member 26, an anode case 28, an anode electrode 30, a third insulation member 32, a manifold 33 connected with an exhaust device 31, and a mask body 34.

The source gas supply device 17 supplies a source gas of a film from one end side in an axial direction (the side pointed by arrow A) of the plurality of cylinders of the cylinder block 12 housed in the housing 24 to the interior of each cylinder. More specifically, the source gas supply device 17 includes pluralities of gas tanks, supply pipes, valves and mass flow controllers, and further includes a collecting pipe at which the plurality of supply pipes are collected. None of these components of the source gas supply device 17 is not shown.

The gas tanks store gases such as oxygen, argon or acetylene. Each supply pipe allows the gas to flow from each gas tank. The collecting pipe is connected airtight with the closing member 18 via a pipe joint that is not shown. Each valve opens and closes each supply pipe and the collecting pipe, and each mass flow controller adjusts a flow rate of a gas flowing in each supply pipe. That is, the source gas supply device 17 can supply a single source gas or a combination of a plurality of types of gases at an arbitrary flow rate into the coupling case 20 via the closing member 18.

The coupling case 20 includes a hollow portion 40 to which the source gas is supplied from the collecting pipe via the closing member 18, and flange portions 42*a*, 42*b* formed at both end sides in the axial direction (the sides pointed by the arrows A and B) of the hollow portion 40. The hollow portion 40 is closed by the closing member 18. The coupling case 20 and the closing member 18 are fixed by screws or the like via the one flange portion 42a, and are electrically insulated by interposing an insulation sheet (not shown) made of an insulation material such as ceramics between the coupling case 20 and the closing member 18.

The other flange portion 42b of the coupling case 20 is fixed to the housing 24 by screws or the like. The first insulation member 22 is made of, for example, an insulation material such as ceramics, and is interposed between a periphery of an opening portion of the coupling case 20 and the housing 24 to electrically insulate them from each other.

The housing 24 is made of a conductive material such as metal, and forms an airtight space in which the cylinder block 12 is housed. More specifically, the housing 24 includes a first wall portion 50 of a disk shape that is in contact with an end surface of the cylinder block 12 on a side of the cylinder bores 14, a sidewall 52 of a rectangular frame shape that surrounds sides of the cylinder block 12, and a second wall portion 54 of a rectangular plate shape that is in contact with an end surface of the cylinder block 12 on a side of the crankcase 16.

The first wall portion 50 includes a thick portion 56 formed at a center side seen from the axial direction, and a thin portion 58 formed at a periphery side and thinner than the thick portion 56. At a portion of the thick portion 56 facing toward the cylinder bore 14, a first opening 60 is formed. In this regard, FIG. 2 does not show the first opening 60.

A sealing member 62 is interposed between an end surface of the cylinder bore 14 and a periphery portion of the first opening 60 to keep airtightness between the cylinder bore 14 and the first opening 60. Via this first opening 60, a source gas from the source gas supply device 17 can be supplied into the cylinders of the cylinder block 12. That is, via the first opening 60, the hollow portion 40 of the coupling case 20 and the interiors of the cylinders of the cylinder block 12 communicate with each other.

The thin portion 58 includes four long holes 64a to 64d in total at both ends in the direction of arrow X in FIG. 2 passing a center in a longitudinal direction of the cylinder block 12 seen from the axial direction, and both ends in the direction of arrow Y in FIG. 2 passing a center in a lateral direction. The long holes 64a, 64b respectively formed at both the ends in the direction of the arrow X of the thin portion 58 have a major axis in the direction of the arrow X, and a minor axis in the direction of the arrow Y. The long holes 64c, 64d respectively formed at both the ends in the direction of the arrow Y of the thin portion 58 have a major axis in the direction of the arrow Y, and a minor axis in the direction of the arrow X.

The sidewall 52 includes a large inner diameter portion 66 at one end on the side pointed by the arrow A, and a small inner diameter portion 68 adjacent to the large inner diameter portion 66 on the side pointed by the arrow B. That is, a step portion 70 is formed between the large inner diameter portion 66 and the small inner diameter portion 68. An inner diameter of the large inner diameter portion 66 is substantially equal to an outer diameter of the thin portion 58 of the first wall portion 50, and an outer circumferential surface of the thin portion 58 is slidable on an inner wall surface of the large inner diameter portion 66. At the step portion 70, pins 72 protruding along the directions of the arrows A, B are vertically arranged. The four pins 72 in total are inserted into the long holes 64a to 64d of the thin portion 58. The diameter of the pins 72 is set slightly smaller than the minor axis of the long holes 64a to 64d.

The inner diameter of the small inner diameter portion 68 is substantially equal to the outer diameter of the thick portion 56 of the first wall portion 50, and an outer circumferential surface of the thick portion 56 is slidable on an inner wall surface of the small inner diameter portion 68. A sealing member 74 is interposed between the inner wall surface of this small inner diameter portion 68 and the outer circumferential surface of the thick portion 56 and keeps airtightness inside the housing 24.

The first wall portion 50 and the sidewall 52 are coupled by, for example, a flexible plate member 76. The plate member 76 extends in the directions of arrows C, D perpendicular to the directions of arrows A, B, and includes one end portion in a direction of the extension (outward end) fixed to an end surface of the sidewall 52 on the side pointed by the arrow A, and another end portion (inward end) fixed to the thick portion 56 of the first wall portion 50 via bolts 78 and cylindrical members 80.

More specifically, through-holes 82 are formed at the other end portions of the plate member 76 along the axial direction, and the cylindrical members 80 are inserted in the through-holes 82 slidably along the axial direction. End portions of the bolts 78 inserted in the cylindrical members 80 are fixed to the thick portion 56 of the first wall portion 50 by screwing or the like. That is, the first wall portion 50 is coupled to the sidewall 52 via the plate member 76, and is relatively movable with respect to the sidewall 52 along the directions of the arrows A, B while keeping airtightness of the housing 24. In this regard, FIG. 2 does not show the plate member 76.

At the other end of the sidewall 52 on the side pointed by the arrow B, the second wall portion 54 is detachably attached. A second opening 84 is formed at a portion of the second wall portion 54 facing toward an opening of the crankcase 16, and the interiors of the cylinders and the anode case 28 communicate with each other via the second opening 84.

The housing 24 is electrically connected to a bias power supply via leads that are not shown, and is thereby applied a negative bias. The negative bias is applied to the cylinder block 12, too, that is in contact with the housing 24, so that the cylinder block 12 functions as a cathode electrode.

The protection member 25 is a cylindrical body that extends along an inner wall surface of the coupling case 20 and an inner wall surface of the first opening 60. An outer circumferential surface of the protection member 25 is in contact with the first insulation member 22, and thereby is arranged distant from the inner wall surface of the coupling case 20. An insulation ring 86 is interposed between the outer circumferential surface of the protection member 25 and the inner wall surface of the first opening 60. An inner circumferential surface of the insulation ring 86 and the outer circumferential surface of the protection member 25 are in contact. Thus, the outer circumferential surface of the protection member 25 is arranged distant from the inner surface of the first opening 60. Another end surface in the axial direction (an end surface on the side pointed by the arrow B) of the protection member 25 is in contact with the sealing member 62. That is, the protection member 25 is electrically insulated from each of the coupling case 20, the first wall portion 50 and the cylinder block 12.

The second insulation member 26 is made of, for example, an insulation material such as ceramics, and is disposed between the housing 24 and the anode case 28 to electrically insulate them from each other. As shown in FIGS. 1 and 3, the second insulation member 26 includes a large inner diameter portion 88 that has an inner diameter substantially equal to the diameter of the second opening 84, and a small inner diameter portion 90 that has a smaller inner diameter than the large inner diameter portion 88. A step portion 92 is formed between the large inner diameter portion 88 and the small inner diameter portion 90.

The anode case 28 includes a hollow portion 93 that communicates with the interiors of the cylinders via the second opening 84, and flange portions 94a, 94b that are formed at both end sides in the axial direction of the hollow portion 93. The anode case 28 is fixed to the housing 24 by screws or the like via the one flange portion 94a and the second insulation member 26, and is fixed to the manifold 33 by screws or the like via the other flange portion 94b and the third insulation member 32.

Hence, in the film forming apparatus 10, the collecting pipe of the source gas supply device 17, the hollow portion 40 of the coupling case 20, the interiors of the cylinders of the cylinder block 12 via the first opening 60 of the housing 24, the hollow portion 93 of the anode case 28 via the second opening 84 of the housing 24, and a chamber 96 in the manifold 33 communicate with each other.

The anode electrode 30 is disposed in and electrically insulated from the anode case 28, and is grounded. Consequently, it is possible to produce a potential difference between the housing 24 and the cylinder block 12 to which the negative bias has been applied, and the anode electrode 30. The third insulation member 32 is made of, for example, an insulation material such as ceramics, and is disposed between the anode case 28 and the manifold 33 to electrically insulate them from each other.

As shown in FIG. 3, the mask body 34 includes a main body portion 104 that is configured to be able to stretch and contract along the axial direction from a first tubular member 100 and a second tubular member 102 that form an insert structure, a sealing member 106, and a biasing member 108.

The first tubular member 100 includes one end surface in the axial direction (an end surface on the side pointed by the arrow A) that is in contact with a border portion between the cylinder bores 14 and the crankcase 16 on the inner surface of the cylinder block 12. A small outer diameter portion 112 is formed at another end side in the axial direction (the side pointed by the arrow B) of the first tubular member 100, has an outer diameter equal to or slightly smaller than an inner diameter of a large inner diameter portion 110 of the second tubular member 102 described below and extends by a predetermined length along the axial direction.

A first flange 114 is arranged at one end portion in the axial direction (an end portion on the side pointed by the arrow A) of the small outer diameter portion 112. The other end side in the axial direction of the small outer diameter portion 112 is inserted in the large inner diameter portion 110 of the second tubular member 102 slidably along the axial direction.

A second flange 116 is formed at one end portion in the axial direction (an end portion on the side pointed by the arrow A) of the second tubular member 102, and opposes to the first flange 114 of the first tubular member 100. The second tubular member 102 includes the large inner diameter portion 110 that extends from one end portion of the second tubular member 102 toward the other end side by a predetermined length, and a small inner diameter portion 118 that extends from the large inner diameter portion 110 to the other end portion in the axial direction and has a smaller inner diameter than the large inner diameter portion 110.

A large outer diameter portion 120 is formed at another end portion in the axial direction (an end portion on the side pointed by the arrow B) of the small inner diameter portion 118, and has an outer diameter substantially equal to an inner diameter of the second opening 84 and the large inner diameter portion 88 of the second insulation member 26. The large outer diameter portion 120 is inserted in the second opening 84 and the large inner diameter portion 110. Therefore, another end surface (an end surface on the side pointed by the arrow B) of the large outer diameter portion 120 is in contact with the step portion 92 of the second insulation member 26.

The sealing member 106 is interposed between an outer circumferential surface of the first tubular member 100 and an inner circumferential surface of the second tubular member 102, i.e., between the sliding surfaces of the first tubular member 100 and the second tubular member 102. Consequently, the first tubular member 100 and the second tubular member 102 are relatively movable along the axial direction while keeping the airtightness between the sliding surfaces of the first tubular member 100 and the second tubular member 102.

The biasing member 108 is formed by, for example, an elastic member such as a coil spring, and is disposed between the first flange 114 and the second flange 116 such that both ends in a stretching direction (axial direction) of the biasing member 108 are in contact with the first flange 114 and the second flange 116, respectively.

Through-holes 114a, 116a are formed in the first flange 114 and the second flange 116, respectively, and are coaxial with the biasing member 108. A bolt 122 is inserted in the through-holes 114a, 116a and the biasing member 108 along the axial direction, and a nut 124 is screwed to another end portion of the bolt 122 that penetrates the through-hole 116a of the second flange 116.

By adjusting a distance between a head portion 126 of the bolt 122 and the nut 124, it is possible to set a maximum separation distance between the first flange 114 and the second flange 116 across the biasing member 108. When the biasing member 108 is compressed between the first flange 114 and the second flange 116, the first tubular member 100 and the second tubular member 102 are resiliently biased in a stretching direction of the main body portion 104.

The film forming apparatus 10 according to the present embodiment is basically configured as described above. Next, a function and an effect of the film forming apparatus 10 will be described in relation to an operation of forming a film on the inner surfaces 14a (film formation portions) of the cylinder bores 14 by using the film forming apparatus 10.

First, the sidewall 52 and the second wall portion 54 are separated apart, the cylinder block 12 is housed in the housing 24, and the mask body 34 is disposed in the housing 24 to expose the inner surface 14a of the cylinder bore 14 and mask the inner surface 16a of the crankcase 16.

More specifically, one end surface in the axial direction of the first tubular member 100 is placed in contact with a border portion between the cylinder bore 14 and the crankcase 16 on the inner surface of the cylinder block 12. The large outer diameter portion 120 formed at the other end side in the axial direction of the second tubular member 102 is inserted in the second opening 84 and the large inner diameter portion 110, and the other end surface of the large outer diameter portion 120 is placed in contact with the step portion 92 of the second insulation member 26. In this case, a separation distance between the head portion 126 of the bolt 122 and the nut 124 is adjusted so as to partially contract the main body portion 104 of the mask body 34 between the cylinder block 12 and the second insulation member 26, against a resilient force of the biasing member 108.

Next, a vacuum pump or the like that is the exhaust device 31 is driven to exhaust the chamber 96. Thus, the hollow portion 93 of the anode case 28, the interiors of the cylinders of the cylinder block 12, and the interior of the hollow portion 40 of the coupling case 20, and the collecting pipe are exhausted.

Next, the source gas supply device 17 starts supplying an oxygen gas via the collecting pipe. At the same time as, or before or after start of supply of this oxygen gas, the bias power supply is driven to apply the negative bias to the cylinder block 12 via the housing 24. As a result, the potential difference is produced between the anode electrode 30 and the cylinder block 12, and the oxygen gas is converted to the plasma state in the coupling case 20 to generate oxygen plasma. Predetermined energy is applied to the oxygen gas during the plasma conversion, and therefore the oxygen plasma has a higher temperature than that of the oxygen gas.

The oxygen plasma having the high temperature cleans and performs so-called plasma etching on the interior of the hollow portion 40 of the coupling case 20, the inner surfaces 14a of the cylinder bores 14 and the inner surface of the main body portion 104 of the mask body 34.

Next, the source gas supply device 17 stops supplying the oxygen gas, and starts supplying an argon gas and an acetylene gas instead of the oxygen gas. The argon gas is converted to the plasma state under actions of the cylinder block 12 that functions as a cathode to which the negative bias is applied, and the anode electrode 30. Similarly, the acetylene gas is also converted to the plasma state to generate argon plasma, carbon plasma, and hydrogen plasma.

The carbon plasma and the hydrogen plasma are attracted, adhered and deposited to the inner surface of the cylinder bore 14 of the cylinder block 12 by an electrical action. Thus, the film made of diamond-like carbon is formed. When this film has a desired thickness, the source gas supply device 17 stops supplying the argon gas and the acetylene gas, and finishes the film formation processing.

In the film forming apparatus 10 according to the present embodiment, as described above, the main body portion 104 is disposed between the cylinder block 12 and the second insulation member 26 in a state where the main body portion 104 partially contracts against the resilient force of the biasing member 108. Consequently, the inner surfaces 14a of the cylinder bores 14 are exposed, and the inner surface 16a of the crankcase 16 is masked.

Consequently, even when the mask body 34 and the cylinder block 12 having received an input of heat from plasma and raised the temperature thermally expand during film formation processing, it is possible to stretch and contract the main body portion 104 following the thermal expansion. Consequently, it is possible to maintain a state where the main body portion 104 is in contact with the inner surface of the cylinder block 12 and the second insulation member 26, and consequently precisely limit a range of the inner surface of the cylinder block 12 irradiated with the plasma.

In this case, as described above, the main body portion 104 stretches and contracts following the thermal expansion of the mask body 34 and the cylinder block 12.

Consequently, the main body portion 104 does not apply an excessively great force to the cylinder block 12 and the second insulation member 26. That is, it is possible to avoid separation between the other end surface of the cylinder block 12 and the second wall portion 54, and consequently prevent a gap that causes leakage of plasma or a source gas from being formed between the cylinder block 12 and the second wall portion 54. Similarly, it is possible to avoid separation between the second insulation member 26 and the second wall portion 54, and consequently keep airtightness between the housing 24 and the anode case 28 well.

As a result, it is possible to precisely form a high quality film on the inner surfaces 14a of the cylinder bores 14 of the cylinder block 12. The mask body 34 resiliently biases the cylinder block 12 with respect to the first wall portion 50, so that it is possible to position and fix the cylinder block 12 in the housing 24. Consequently, it is not necessary perform fastening, so that a simple configuration makes it possible to efficiently set the cylinder block 12 in the housing 24, and improve mass production efficiency.

As described above, the sealing member 106 is interposed between the sliding surfaces of the first tubular member 100 and the second tubular member 102 that form the main body portion 104. By this means, too, it is possible to maintain a vacuum state of the interior of the main body portion 104 well during film formation, and prevent leakage of plasma or a source gas of a film from between the sliding surfaces to the outside of the main body portion 104.

Consequently, it is possible to keep good film formation quality.

In the main body portion 104, the inlet that enables an inflow of a gas or the like toward the sealing member 106 between the sliding surfaces of the first tubular member 100 and the second tubular member 102 is between the other end portion of the first tubular member 100 and the inner circumferential surface of the second tubular member 102 and between the one end portion of the second tubular member 102 and the outer circumferential surface of the first tubular member 100.

In the film forming apparatus 10 according to the present embodiment, as described above, the small outer diameter portion 112 of the first tubular member 100 is inserted in the large inner diameter portion 110 of the second tubular member 102. Therefore, the outer circumferential surface of the first tubular member 100 and the inner circumferential surface of the second tubular member 102 are in sliding contact. Therefore, compared to the other end portion in the axial direction of the first tubular member 100, the one end portion in the axial direction of the second tubular member 102 near the first opening 60 is disposed at the outer circumference side of the first tubular member 100. That is, the one end portion of the second tubular member 102 is disposed outside the plasma generation space. Consequently, the inflow of plasma or the like from between the one end portion of the second tubular member 102 and the outer circumferential surface of the first tubular member 100 toward the sealing member 106 is prevented.

The other end portion of the first tubular member 100 disposed inside the plasma generation space at the inner circumference side of the second tubular member 102 is distant from the first opening 60, and is thereby disposed at a portion of a low plasma concentration compared to the portion around the first opening 60. Consequently, the inflow of plasma from between the other end portion of the first tubular member 100 and the inner circumferential surface of the second tubular member 102 toward the sealing member 106 is prevented.

As a result, it is possible to prevent deterioration of the sealing member 106 due to contact with the plasma or the like. Eventually, it is also possible to prevent the biasing member 108 from contacting plasma or the like and consequently improve durability of the mask body 34.

As described above, in the film forming apparatus 10, the first wall portion 50 is attached to the sidewall 52 while keeping airtightness of the housing 24 and being movable along the directions of arrows A, B. Even when the cylinder block 12 thermally expands during film formation, the first wall portion 50 moves following the thermal expansion. Consequently, it is possible to avoid application of an excessively great force from the cylinder block 12 to the first wall portion 50 and the second wall portion 54 in a direction in which the first wall portion 50 and the second wall portion 54 move away from each other. Consequently, it is possible to maintain a vacuum state in the housing 24 well during film formation, and consequently form a high quality film on the inner surfaces 14a of the cylinder bores 14.

The cylinder block 12 often has a different thermal expansion amount per portion having a different thickness. When a difference in this thermal expansion amount produces variations in a force to be applied to each portion of the first wall portion 50 from the cylinder block 12, the first wall portion 50 inclines in the directions of the arrows C, D in some cases.

In the film forming apparatus 10, as described above, the first wall portion 50 can be relatively displaced with respect to the pins 72 along the directions of the arrows A, B, and major axis directions of the long holes 64a to 64d. Consequently, it is possible to prevent misalignment of the cylinders and the first opening 60, and allow inclination of the first wall portion 50.

Consequently, even when the first wall portion 50 inclines, it is possible to avoid contact of the protection member 25 with the inner wall surface of the first opening 60 and the inner wall surface of the coupling case 20, and maintain an electrically insulated state from each other. Consequently, the protection member 25 can avoid adhesion of the film to the inner wall surface of the coupling case 20 and the inner wall surface of the first opening 60, and prevent formation of the film on the protection member 25. Consequently, it is possible to easily maintain the film forming apparatus 10.

The present invention is not particularly limited to the above embodiment, and can be variously modified without departing from the scope of the invention.

What is claimed is:

1. A film forming apparatus configured to form a film at a film formation portion on an inner surface of a cylindrical work, the film forming apparatus comprising a mask body configured to expose the film formation portion and mask a non-formation portion of the inner surface of the work where the film is not formed, wherein the mask body includes:
   a main body portion configured to stretch and contract in an axial direction, and including a plurality of tubular members configured to have an insert structure at least part of which is slidable along the axial direction;
   a sealing member interposed between sliding surfaces of the tubular members; and
   a biasing member configured to exert a resilient force on the tubular members so that the main body portion stretches in the axial direction; and
   the main body portion is provided to be capable of stretching and contracting in a state in which at least one end in the axial direction of the main body portion is in contact with the inner surface of the work, while being contracted against the resilient force exerted by the biasing member.

2. The film forming apparatus according to claim 1, further comprising:
   a housing including a first wall portion in contact with one end side in the axial direction of the work, and a second wall portion in contact with another end side, the housing configured to form an airtight space in which the work is housed;
   a source gas supply device configured to supply a source gas of the film to an interior of the work via a first opening formed in the first wall portion;
   an anode case communicating with the interior of the work via a second opening formed in the second wall portion, and electrically insulated from an anode electrode;
   an insulation member interposed between the anode case and the housing to electrically insulate the anode case and the housing from each other; and
   an exhaust device configured to exhaust the interior of the work and an interior of the housing via the anode case; and
   the one end in the axial direction of the main body portion is in contact with the inner surface of the work, and another end is in contact with the insulation member via the second opening.

3. The film forming apparatus according to claim 2, wherein:
   the plurality of tubular members include:
   a first tubular member including one end side in the axial direction which is in contact with the inner surface of the work; and
   a second tubular member disposed near the second wall portion compared to the first tubular member; and
   an outer circumferential surface of the first tubular member and an inner circumferential surface of the second tubular member are in sliding contact with each other.

* * * * *